United States Patent

Palasi et al.

[11] Patent Number: 5,949,138
[45] Date of Patent: Sep. 7, 1999

[54] HEAT SPREADER

[75] Inventors: Primitivo A. Palasi; Ronaldo M. Arguelles, both of Baguio, Philippines; Philip B. Simon, Houston, Tex.

[73] Assignee: Texas Instruments Incorporated, Dallas, Tex.

[21] Appl. No.: 08/962,159

[22] Filed: Oct. 31, 1997

Related U.S. Application Data

[60] Provisional application No. 60/028,796, Oct. 31, 1996.

[51] Int. Cl.$^6$ .............................. H01L 23/34; H01L 23/10
[52] U.S. Cl. .......................... 257/712; 257/706; 257/675; 257/783; 257/666
[58] Field of Search ................................. 257/712, 717, 257/725, 729, 730, 706, 675, 796, 783, 705, 707, 713, 666, 773, 762–765; 438/FOR 408, FOR 409; 361/813

[56] References Cited

U.S. PATENT DOCUMENTS

| | | | |
|---|---|---|---|
| 5,206,794 | 4/1993 | Long | 257/675 |
| 5,477,081 | 12/1995 | Nagayoshi | 257/704 |
| 5,644,164 | 7/1997 | Roh | 257/712 |
| 5,783,860 | 7/1998 | Jeng et al. | 257/706 |

FOREIGN PATENT DOCUMENTS

| | | | |
|---|---|---|---|
| 54-140469 | 10/1979 | Japan | 257/704 |
| 59-207645 | 11/1984 | Japan | 257/675 |

*Primary Examiner*—Valencia Martin-Wallace
*Assistant Examiner*—Jhihan B Clar
*Attorney, Agent, or Firm*—Jacqueline J. Garner; Wade James Brady; Richard L. Donaldson

[57] ABSTRACT

A heat spreader (10) is provided for dissipating heat from a semiconductor die (32). The heat spreader (10) comprises a thermally conductive sheet (12) having an aperture (14) formed therein. At least one set of opposing members (20) extends inwardly, but do not contact, within the aperture (14). The opposing members (20) can receive adhesive material for securing the semiconductor die (32) to the heat spreader (10) such that the semiconductor die (32) is disposed over the aperture (14).

20 Claims, 2 Drawing Sheets

HEAT SPREADER

This application claims benefit of application Ser. No. 60/028796 filed Oct. 31, 1996.

TECHNICAL FIELD OF THE INVENTION

The present invention relates generally to semiconductor packaging, and more particularly, to an improved heat spreader.

BACKGROUND OF THE INVENTION

A silicon die on which a semiconductor device is implemented will generate heat during operation of the semiconductor device. Generally, if the heat is allowed to accumulate beyond a critical point, the semiconductor device may cease to operate properly. Consequently, previous techniques for packaging silicon dies have incorporated a device known as a "heat spreader," so named because it served to dissipate heat from a silicon die. Prior heat spreaders were formed as a solid metal sheet, to which a silicon die would be attached over the die's entire bottom surface. These prior heat spreaders, however, suffered from numerous problems.

For example, mold compound, which is used to encase a silicon die in a packaged semiconductor device, does not adhere to metal as well as it adheres to silicon. Adhesion between materials in a packaged device is desirable because such adhesion enhances the integrity of the package. That is, the packaged device is better able to withstand various forces that may act upon it, such as pressure created by the vaporization of internal moisture during a baking treatment. With prior heat spreaders, mold compound could only contact a silicon die on an upper surface. Contact between mold compound and the silicon die at the die's bottom surface was prevented by the solid sheet of the heat spreader. Consequently, prior heat spreaders weakened the integrity of a packaged device.

Furthermore, packaged semiconductor devices which incorporated prior heat spreaders were especially moisture sensitive. This moisture sensitivity was largely attributable to the fact that the materials from which the silicon die and the heat spreader were formed did not expand and contract at the same volume rate in response to the addition or substraction of heat. The silicon die was formed from silicon, whereas the prior heat spreader was typically formed from metal. Metal expands and contracts more rapidly than silicon when exposed to changes in heat. Thus, during a bake process intended to remove moisture from a packaged semiconductor device, mechanical stress was generated over the area at which the silicon die and the heat spreader were attached—i.e., the entire bottom surface of the silicon die. If the packaged semiconductor device was baked for a long time in order to remove a large amount of moisture, the mechanical stress between the silicon die and the heat spreader would cause the semiconductor packaging to burst in a "popcorn effect."

SUMMARY OF THE INVENTION

In accordance with the present invention, the disadvantages and problems associated with prior heat spreaders have been substantially reduced or eliminated.

According to an embodiment of the present invention, a device is provided for dissipating heat from a semiconductor die. The device comprises a thermally conductive sheet having an aperture formed therein. At least one set of opposing members extends inwardly, but do not contact, within the aperture. The opposing members can receive adhesive material for securing the semiconductor die to the device such that the semiconductor die is disposed over the aperture.

According to another embodiment of the present invention, a packaged semiconductor device includes a semiconductor die. A heat spreader comprises a thermally conductive sheet having an aperture formed therein and at least one set of opposing members extending inwardly in the aperture. The heat spreader is attached to the semiconductor die at the opposing members such that the semiconductor die is disposed over the aperture. The heat spreader transfers heat away from the semiconductor die. A leadframe is attached to the heat spreader. The leadframe transfers heat away from the heat spreader.

The present invention provides various technical advantages over prior devices for dissipating heat in a packaged silicon die. One technical advantage includes an improved heat spreader formed as a sheet of thermally conductive material having an aperture and one or more members extending therein. A semiconductor die may be disposed over the aperture and attached to the heat spreader at the members. When mold compound is introduced to encase the semiconductor die and the heat spreader, the mold compound is able to contact the semiconductor die both from above and from below, via the aperture. Other technical advantages are readily apparent to one skilled in the art from the following figures, description, and claims.

BRIEF DESCRIPTION OF THE DRAWINGS

For a more complete understanding of the present invention and for advantages thereof, reference is now made to the following description taken in conjunction with the accompanying drawings, wherein like reference numerals represent like parts, in which.

DETAILED DESCRIPTION OF THE INVENTION

The present invention and its advantages are best understood by referring to FIGS. 1–5 of the drawings, like numerals being used for like and corresponding parts of the various drawings.

Figure 1:
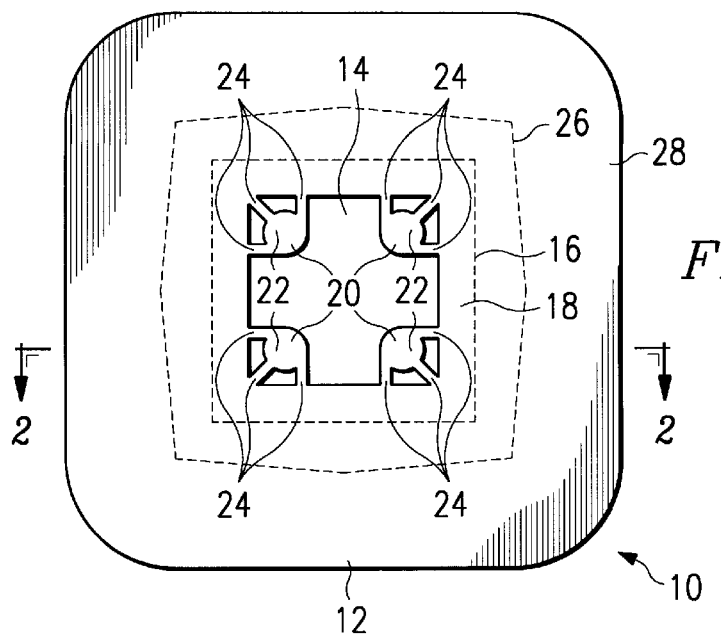
FIG. 1 is a plan view of one embodiment of a heat spreader constructed in accordance with the teachings of the present invention.

FIG. 1 is a plan view of a heat spreader 10 according to an embodiment of the present invention. Heat spreader 10 is formed as a sheet 12 of thermally conductive material 12. Sheet 12 may comprise copper, aluminum, gold, silver, titanium, or any other thermally conductive material. This material may have a particular thermal coefficient of expansion, which defines the volume rate of change for the material with a change in temperature.

An aperture 14 is formed within sheet 12. Generally, aperture 14 may have any shape, such as, for example, circular, triangular, rectangular, or trapezoidal. FIG. 1 illustrates a rectangularly shaped aperture 14 with a plurality of corners. Preferably, aperture 14 has a shape that is substantially similar to the perimeter edge of a semiconductor die which may be attached to heat spreader 10. An exemplary perimeter edge is represented by a dotted line 16. As shown, the size of aperture 14 can be such that there is a region of overlap 18 between sheet 12 and a semiconductor die proximate aperture 14. Furthermore, the size of an aperture can be varied from one embodiment to another to accommodate semiconductor dies of different sizes. For example, an aperture of one size may be used with die sizes ranging between 6.6000 and 9.5000 mm, whereas an aperture of another size may be used with die sizes ranging between 9.6000 and 12.3935 mm.

A number of members 20 extend inwardly into aperture 14 from sheet 12. Members 20 may be integral to sheet 12, and thus made from the same material. Each member 20 may function as a point of attachment for a semiconductor die. Consequently, members 20 can be formed in sets of opposing pairs so that the attachment of a semiconductor die is balanced across aperture 14. Preferably, members 20 do not contact each other within aperture 14. As shown, each member 20 extends from a corner of aperture 14 and may comprise a platform 22 coupled to sheet 12 by one or more extensions 24. In this embodiment, three extensions 24 are provided for each platform 22.

Heat spreader 10 generally functions to transfer heat from an attached semiconductor die out to a leadframe. The leadframe typically comprises a layer of material having an aperture formed therein, the semiconductor die being disposed within such aperture in a packaged device. A dotted line 26 represents the perimeter edge of an exemplary leadframe aperture. As shown, there can be a region of overlap 28 between the leadframe and heat spreader 10.

Figure 2:
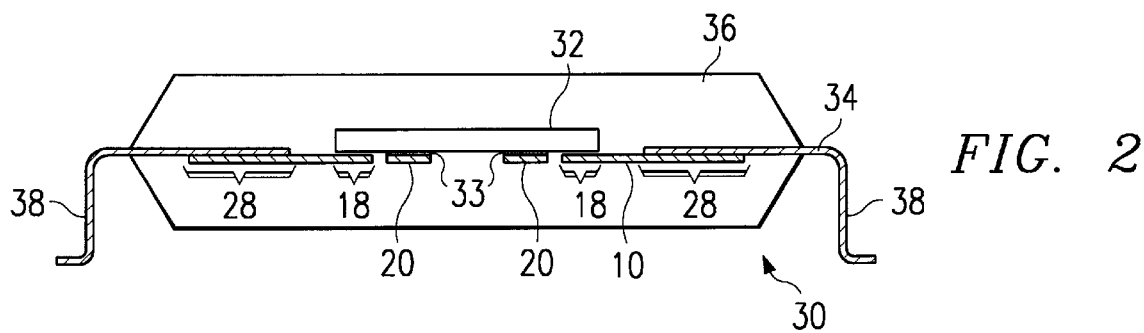
FIG. 2 is a cross sectional view of a packaged semiconductor device incorporating the heat spreader shown in FIG. 1.

FIG. 2 is a cross-sectional view of a packaged semiconductor device 30, which incorporates heat spreader 10. This view includes a cross-section of heat spreader 10 taken along line A—A in FIG. 1. Packaged device 30 comprises heat spreader 10, semiconductor die 32, leadframe 34, and mold casing 36.

Semiconductor die 32 is disposed over aperture 14 of heat spreader 10. Semiconductor die 32 may be attached to heat spreader 10 with an adhesive 33, such as epoxy, at members 20. It should be noted that the vertical dimensions of adhesive 33 are exaggerated in FIG. 2 for clarity. Semiconductor die 32 is formed from a semiconductor material, such as silicon. Such semiconductor material may have a characteristic thermal coefficient of expansion which differs from the thermal coefficient of the material from which heat spreader 10 is formed. A semiconductor device may be implemented on semiconductor die 32.

Leadframe 34 is attached to heat spreader 10 at overlap 28. Leadframe 34 may be formed of a thermally and electrically conductive material, such as gold, aluminum, steel, titanium or the like. Among other things, leadframe 34 functions to provide electrical connection of the semiconductor device implemented on semiconductor die 32. For this purpose, leadframe 34 comprises one or more pins 38.

Mold casing 36 encases semiconductor die 32, heat spreader 10, and a portion of leadframe 34. Mold casing 36 may be formed from a mold compound, such as plastic or other polymer material. Mold casing 36 functions to secure the relative positioning of heat spreader 10, semiconductor die 32, and leadframe 34, and also to protect the semiconductor device implemented on semiconductor die 32.

Packaged semiconductor device 30 may be formed in the following manner. Heat spreader 10 is attached to leadframe 34 at overlap 28. Semiconductor die 32 is then attached to heat spreader 10 with adhesive 33 at members 20 such that semiconductor die 32 is disposed over aperture 14. Mold compound is then used to form mold casing 36. The mold compound contacts semiconductor die 32 both from above and from below, via aperture 14 of heat spreader 10. The packaged semiconductor device can then be baked in order to remove moisture.

Mold compound adheres better to semiconductor material (e.g., silicon) than it does to metal. Accordingly, because the mold compound contacts semiconductor die 32 from above and below in packaged semiconductor device 30, adhesion of semiconductor die 32 to mold casing 36 is superior to that in prior devices. The superior adhesion improves the integrity of packaged semiconductor device 30, as compared to devices which incorporated a prior heat spreader.

The heat of the baking process may cause both semiconductor die 32 and heat spreader 10 to expand. As described above, the material from which semiconductor die 32 is formed may have a different thermal coefficient of expansion from that of the material from which heat spreader 10 is formed. Consequently, semiconductor die 32 and heat spreader 10 may not expand at the same volume rate in response to the heat of the baking process. The difference in expansion rates creates mechanical stress at the points where semiconductor die 32 and heat spreader 10 are attached. However, because semiconductor die 32 and heat spreader 10 are preferably attached only at members 20, this mechanical stress is substantially less than that of prior devices where attachment was over the entire surface area of a silicon die. Furthermore, members 20 do not contact each other, and therefore, are able to expand in relative independence. Accordingly, mechanical stress is further reduced because members 20 do not cooperate over a single area of attachment. Thus, a packaged semiconductor device 30 of the present invention is less susceptible to bursting in a "popcorn effect."

In operation, heat spreader 10 dissipates heat away from semiconductor die 32. In particular, heat may be transferred from semiconductor die 32 to heat spreader 10 at members 20 and overlap 18. This heat is then transferred from heat spreader 10 to leadframe 34 at overlap 28.

Figure 3:
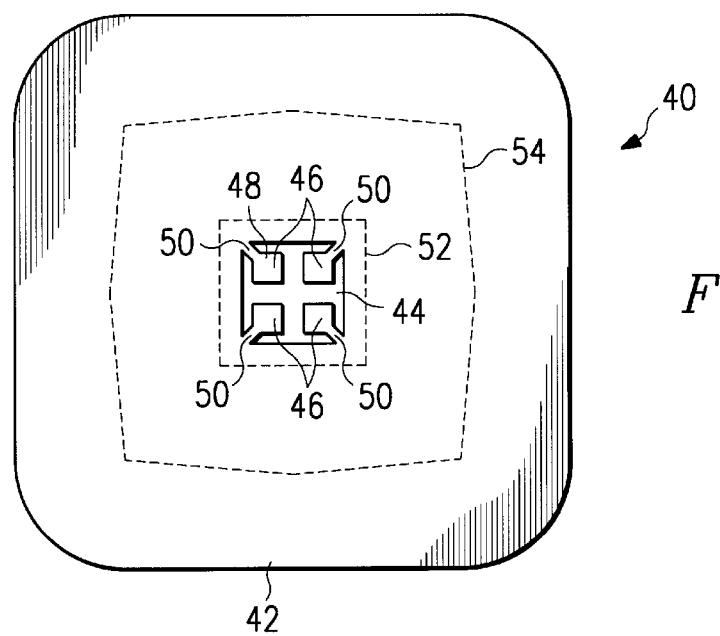
FIG. 3 is a plan view of another embodiment of a heat spreader constructed in accordance with the teachings of the present invention.
Figure 4:
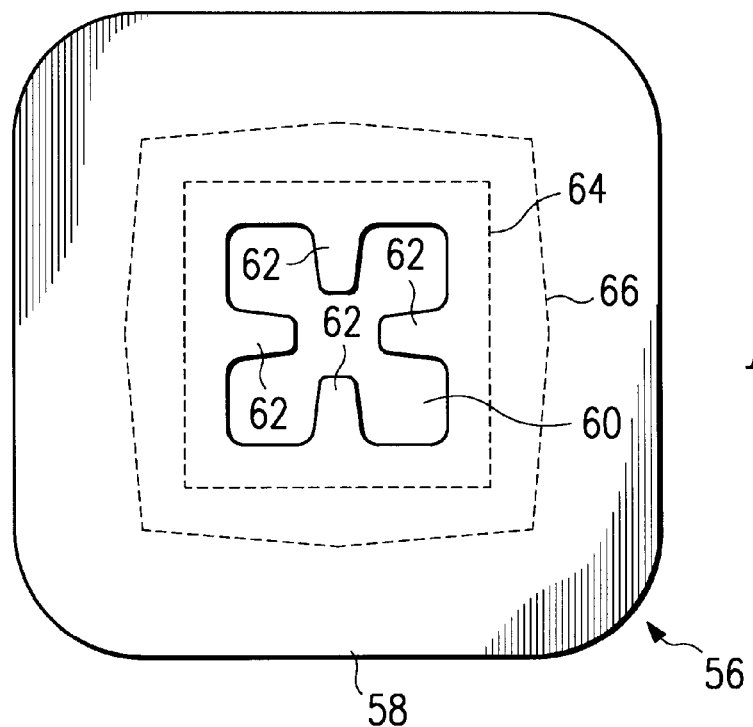
FIG. 4 is a plan view of yet another embodiment of a heat spreader constructed in accordance with the teachings of the present invention.
Figure 5:
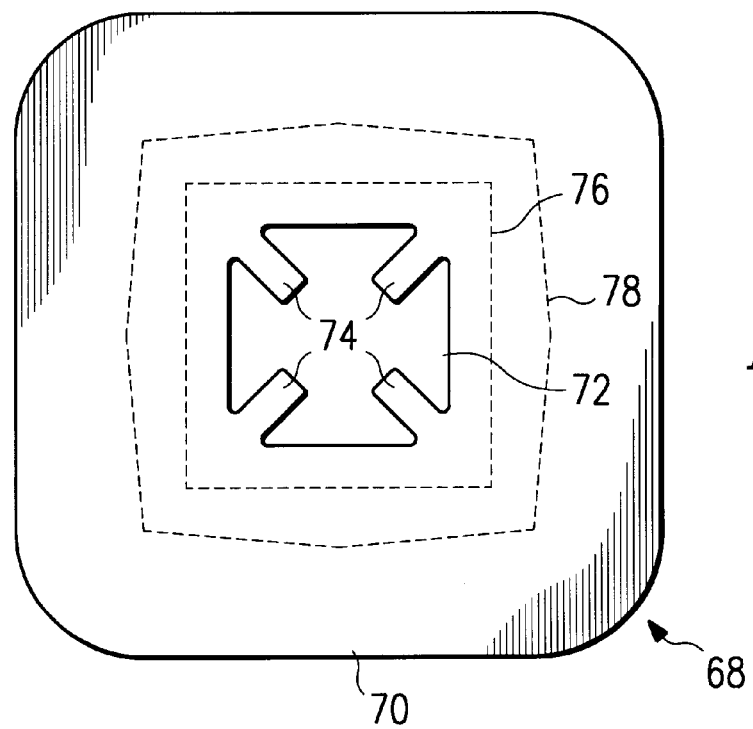
FIG. 5 is a plan view of yet another embodiment of a heat spreader constructed in accordance with the teachings of the present invention.

Each of FIGS. 3–5 illustrate other embodiments of a heat spreader constructed in accordance with the teachings of the present invention. These embodiments provide substantially the same technical features and advantages of the embodiment shown and described with reference to FIGS. 1 and 2.

FIG. 3 is a plan view of a heat spreader 40 according to another embodiment of the present invention. Like heat spreader 10 shown in FIG. 1, heat spreader 40 may be formed as a sheet 42 having an aperture 44 formed therein. The size of aperture 44, however, is smaller than the size of aperture 14 of heat spreader 10. A plurality of members 46 extend into aperture 44 and may be integral with sheet 42. Each member 46 may comprise a platform 48 coupled to sheet 42 with a single connection 50, as opposed to the multiple connections 24 shown in FIG. 1 for heat spreader 10.

Heat spreader 40 may attached to a semiconductor die and a leadframe within a packaged semiconductor device in substantially the same manner as shown and described above with reference to FIGS. 1 and 2. A dotted line 52 represents the perimeter edge for an exemplary semiconductor die. A dotted line 54 represents the perimeter edge of a leadframe aperture. Because the size of aperture 44 is smaller than the size of aperture 14 shown in FIG. 2, heat spreader 40 can be used with smaller size semiconductors dies.

FIG. 4 is a plan view of a heat spreader 56 according to another embodiment of the present invention. Heat spreader 56 comprises a sheet 58 having an aperture 60 with members 62 extending therein. Aperture 60 is substantially rectangular in shape like apertures 14 and 44 shown in FIGS. 1 and 3, respectively. Members 62, however, differ from members 20 and 46 shown in FIGS. 1 and 3 in that members 62 extend from the sides of the rectangular shape instead of the corners. Furthermore, members 62 do not comprise platforms like members 20 and 46. However, a semiconductor die may be still be attached to members 62 using adhesive. Dotted lines 64 and 66 represent an exemplary semiconductor die perimeter edge and a leadframe aperture edge, respectively.

FIG. 5 is a plan view of a heat spreader 68 according to another embodiment of the present invention. Heat spreader 68 comprises a sheet 70 in which an aperture 72 is formed. Aperture 72 is substantially rectangular in shape, and thus defines a plurality of corners. A number of members 74 extend inwardly from the corners of aperture 72. Unlike members 20 and 46 shown in FIGS. 1 and 3, members 74 do not comprise platforms. A dotted line 76 represents the perimeter edge of exemplary semiconductor die which may be attached to heat spreader 68 at members 74. A dotted line 78 represents an exemplary leadframe aperture edge.

Although the present invention and its advantages have been described in detail, it should be understood that various changes, substitutions, and alterations can be made therein without departing from the spirit and scope of the invention as defined by the appended claims.

What is claimed is:

1. A device for dissipating heat from a semiconductor die comprising a thermally conductive sheet having an aperture formed therein and at least one set of opposing members extending inwardly but not contacting within the aperture, the opposing members operable to receive adhesive material for securing the semiconductor die such that the semiconductor die is disposed over the aperture.

2. The device of claim 1, wherein each opposing member further comprises:

at least one extension extending inwardly in the aperture from the thermally conductive sheet; and a platform coupled to the extension.

3. The device of claim 1, wherein the aperture has a shape that is substantially similar to a perimeter edge of the semiconductor die such that the semiconductor die overlaps the thermally conductive sheet at the perimeter edge when secured to the device.

4. The device of claim 1, wherein the aperture has a substantially rectangular shape.

5. The device of claim 1, wherein:

the aperture has a substantially rectangular shape defining a plurality of corners; and each opposing member further comprises an extension extending inwardly in the aperture from a corner.

6. The device of claim 5, wherein each opposing member further comprises a platform connected to the extension.

7. The device of claim 1, wherein:

the aperture has a substantially rectangular shape defining a plurality of sides; and each opposing member further comprises an extension extending inwardly in the aperture from a side.

8. The device of claim 1, wherein the device is formed from metal.

9. The device of claim 1, wherein the device is formed from a material selected from the group comprising copper, aluminum, gold, silver, and titanium.

10. A device for dissipating heat from a semiconductor die, comprising:

a thermally conductive sheet having an aperture formed therein, the aperture having a shape that is substantially similar to a perimeter edge of the semiconductor die;

at least one set of opposing members coupled to the thermally conductive sheet and extending inwardly but not contacting within the aperture, the opposing members operable to receive adhesive material for securing the semiconductor die such that the semiconductor die is disposed over the aperture; and wherein the semiconductor die overlaps the thermally conductive sheet at the perimeter edge when secured to the device.

11. The device of claim 10, wherein each opposing member further comprises:

at least one extension extending inwardly in the aperture from the thermally conductive sheet; and a platform coupled to the extension.

12. The device of claim 10, wherein:

the aperture has a substantially rectangular shape defining a plurality of corners; and each opposing member further comprises an extension extending inwardly in the aperture from a corner.

13. The device of claim 12, wherein each opposing member further comprises a platform connected to the extension.

14. The device of claim 10, wherein:

the aperture has a substantially rectangular shape defining a plurality of sides; and each opposing member further comprises an extension extending inwardly in the aperture from a side.

15. The device of claim 10, wherein the device is formed from a material selected from the group comprising copper, aluminum, gold, silver, and titanium.

16. A packaged semiconductor device comprising:

a semiconductor die;

a heat spreader comprising a thermally conductive sheet having an aperture formed therein and at least one set of opposing members extending inwardly in the aperture, the heat spreader attached to the semiconductor die at the opposing members such that the semiconductor die is disposed over the aperture, the heat spreader operable to transfer heat away from the semiconductor die; and a leadframe attached to the heat spreader, the leadframe operable to transfer heat away from the heat spreader.

17. The device of claim 16, wherein:

the semiconductor die has a perimeter edge; and the aperture has a shape substantially similar to the perimeter edge of the semiconductor die such that the semiconductor die overlaps the thermally conductive sheet.

18. The device of claim 16, further comprising mold compound in contact with the semiconductor die at an upper surface, the mold compound in further contact with the semiconductor die at a bottom surface through the aperture.

19. The device of claim 16, wherein:

the aperture has a substantially rectangular shape defining a plurality of corners; and each opposing member further comprises an extension extending inwardly in the aperture from a corner.

20. The device of claim 16, wherein:

the aperture has a substantially rectangular shape defining a plurality of sides; and each opposing member further comprises an extension extending inwardly in the aperture from a side.

\* \* \* \* \*